United States Patent
Xu et al.

(10) Patent No.: US 8,204,456 B2
(45) Date of Patent: Jun. 19, 2012

(54) SYSTEMS AND METHODS FOR SPURIOUS EMISSION CANCELLATION

(75) Inventors: Bing Xu, Gilbert, AZ (US); Clive Tang, Chandler, AZ (US); Mahibur Rahman, Chandler, AZ (US)

(73) Assignee: Fujitsu Semiconductor Limited, Kanagawa (JP)

( * ) Notice: Subject to any disclaimer, the term of this patent is extended or adjusted under 35 U.S.C. 154(b) by 85 days.

(21) Appl. No.: 12/882,498

(22) Filed: Sep. 15, 2010

(65) Prior Publication Data

US 2012/0064847 A1  Mar. 15, 2012

(51) Int. Cl.
*H04B 1/04* (2006.01)

(52) U.S. Cl. ........... 455/114.3; 455/91; 455/127.3; 455/114.2; 375/295; 375/296; 375/297; 330/136; 330/149; 330/151

(58) Field of Classification Search ........... 455/91, 455/114.3, 127.3, 114.2; 375/295, 296, 297; 330/151, 149, 136
See application file for complete search history.

(56) References Cited

U.S. PATENT DOCUMENTS

| | | | |
|---|---|---|---|
| 5,920,808 A * | 7/1999 | Jones et al. | 455/127.1 |
| 6,476,670 B1 | 11/2002 | Wright et al. | 330/2 |
| 6,587,514 B1 | 7/2003 | Wright et al. | 375/296 |
| 6,798,843 B1 | 9/2004 | Wright et al. | 375/296 |
| 6,934,341 B2 * | 8/2005 | Sahlman | 375/297 |
| 7,197,085 B1 | 3/2007 | Vella-Coleiro | 375/296 |
| 7,248,642 B1 | 7/2007 | Vella-Coleiro | 375/296 |
| 7,266,159 B2 | 9/2007 | Vella-Coleiro | 375/296 |
| 2002/0008578 A1 | 1/2002 | Wright et al. | 330/149 |
| 2003/0058959 A1 | 3/2003 | Rafie et al. | 375/296 |
| 2003/0231716 A1 | 12/2003 | Unger | 375/296 |
| 2004/0190644 A1 | 9/2004 | Nemer et al. | 375/296 |
| 2005/0017800 A1 * | 1/2005 | Robinson | 330/149 |
| 2005/0057303 A1 | 3/2005 | Leffel | 330/75 |
| 2005/0099230 A1 | 5/2005 | Shanbhag | 330/149 |
| 2005/0123066 A1 | 6/2005 | Sarca | 375/296 |
| 2006/0046665 A1 | 3/2006 | Yang et al. | 455/114.3 |
| 2006/0082413 A1 | 4/2006 | Shanbhag | 330/149 |
| 2006/0133536 A1 | 6/2006 | Rexberg | 375/297 |
| 2008/0089440 A1 | 4/2008 | Curtis | 375/296 |
| 2009/0097590 A1 | 4/2009 | McCallister et al. | 375/296 |
| 2009/0227216 A1 | 9/2009 | Lozhkin | 455/114.3 |
| 2010/0054364 A1 | 3/2010 | Cai et al. | 375/296 |

* cited by examiner

*Primary Examiner* — Tuan Pham
(74) *Attorney, Agent, or Firm* — Baker Botts L.L.P.

(57) ABSTRACT

In accordance with some embodiments of the present disclosure, a method may include digitally pre-distorting a digital baseband signal with an opposite phase of a C-IM3 distortion term such that the pre-distortion and C-IM3 distortion cancel each other out in a transmitter. The method may also include digitally conditioning the pre-distorted digital signal in order to provide a flat amplitude response of a composite filter comprising a baseband filter and a digital half-band filter of the transmitter, and to provide a linear phase response for the composite filter.

24 Claims, 5 Drawing Sheets

SYSTEMS AND METHODS FOR SPURIOUS EMISSION CANCELLATION

TECHNICAL FIELD

The present disclosure relates generally to wireless communication and, more particularly, to cancellation of spurious emission in wireless communication devices.

BACKGROUND

Wireless communications systems are used in a variety of telecommunications systems, television, radio and other media systems, data communication networks, and other systems to convey information between remote points using wireless transmitters and wireless receivers. A transmitter is an electronic device which, usually with the aid of an antenna, propagates an electromagnetic signal such as radio, television, or other telecommunications. Transmitters often include signal amplifiers which receive a radio-frequency or other signal, amplify the signal by a predetermined gain, and communicate the amplified signal. On the other hand, a receiver is an electronic device which, also usually with the aid of an antenna, receives and processes a wireless electromagnetic signal. In certain instances, a transmitter and receiver may be combined into a single device called a transceiver.

Wireless communication systems are commonly susceptible to spurious emissions. Spurious emissions are undesired signals that appear in electronic equipment, often at a harmonic frequency of desired signals. In transmitters and transmit paths of transceivers, a type of spurious emission known as 4 times baseband or "4×BB" spurious emission may occur. 4×BB emission often occurs at interfaces among baseband filters, upconversion mixers, and variable gain amplifiers in a transmit path, and causes two distortion terms on either side of a carrier frequency for a radio-frequency signal. The 4×BB peaks often occur at a frequency that is higher or lower than the carrier frequency in an amount equal to four times the baseband signal offset frequency. 4×BB spurious emission may also be known as C-IM3 (3rd order distortion) and folded C-IM3 (5th order distortion). In some cases, 4×BB spurious emissions may occur at magnitudes that may violate relevant wireless communication standards (e.g., 3rd Generation Partnership Project or "3GPP") or cause operational problems in wireless communication devices.

4×BB spurious emissions are seen to be created by a wireless communication device's nonlinear effects on baseband signals and carrier signals, hence, 4×BB emissions may be cancelled out by digitally pre-distorting the digital baseband signal with the opposite phase of the predicted emissions.

In order to limit emission and noise, analog filters are deployed along with digital filters in transmitters. The 3 decibel (dB) bandwidth of the composite filters is often chosen to be comparable to transmitted signal bandwidth. Due to frequency hopping in a 3GPP Long-Term Evolution (LTE) system, for any digital pre-distortion to work effectively, the composite filter needs to have a flat amplitude response from direct current to the frequency of the 4×BB distortion terms. In addition, it is desirable that the composite filter have a linear phase response. A linear phase response may be achieved by applying a pre-emphasis filter to the predicted emissions of the digital pre-distortion.

Effective pre-emphasis and pre-distortion may be complicated by the numerous factors, including:

process variations that may cause an analog filter response to vary;

temperature variations may cause physical characteristics of analog filters to vary, thus leading to variance of analog filter response;

temperature variations may cause impedance changes at an interface between a switching mixer and a variable gain array input, as does the nonlinear effects causing 4×BB emissions;

a power control system may alter variable gain amplifier gain on LTE time slot boundaries, thus altering loading seen by a mixer; and a power control system may alter signal strength to a mixer.

The above factors may require different pre-distortion and pre-emphasis filter designs to maximize performance.

The foregoing section merely provides a background to the embodiments of the present disclosure, and no portion thereof shall be construed as an admission of prior art.

SUMMARY

In accordance with some embodiments of the present disclosure, a method may include digitally pre-distorting a digital baseband signal with an opposite phase of a C-IM3 distortion term such that the pre-distortion and C-IM3 distortion cancel each other out in a transmitter. The method may also include digitally conditioning the pre-distorted digital signal in order to provide a flat amplitude response of a composite filter comprising a baseband filter and a digital half-band filter of the transmitter, and to provide a linear phase response for the composite filter.

Technical advantages of one or more embodiments of the present disclosure may include effective mechanisms to eliminate spurious emissions in transmitters, including C-IM3 distortion.

It will be understood that the various embodiments of the present disclosure may include some, all, or none of the enumerated technical advantages. In addition, other technical advantages of the present disclosure may be readily apparent to one skilled in the art from the figures, description and claims included herein.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Figure 1:
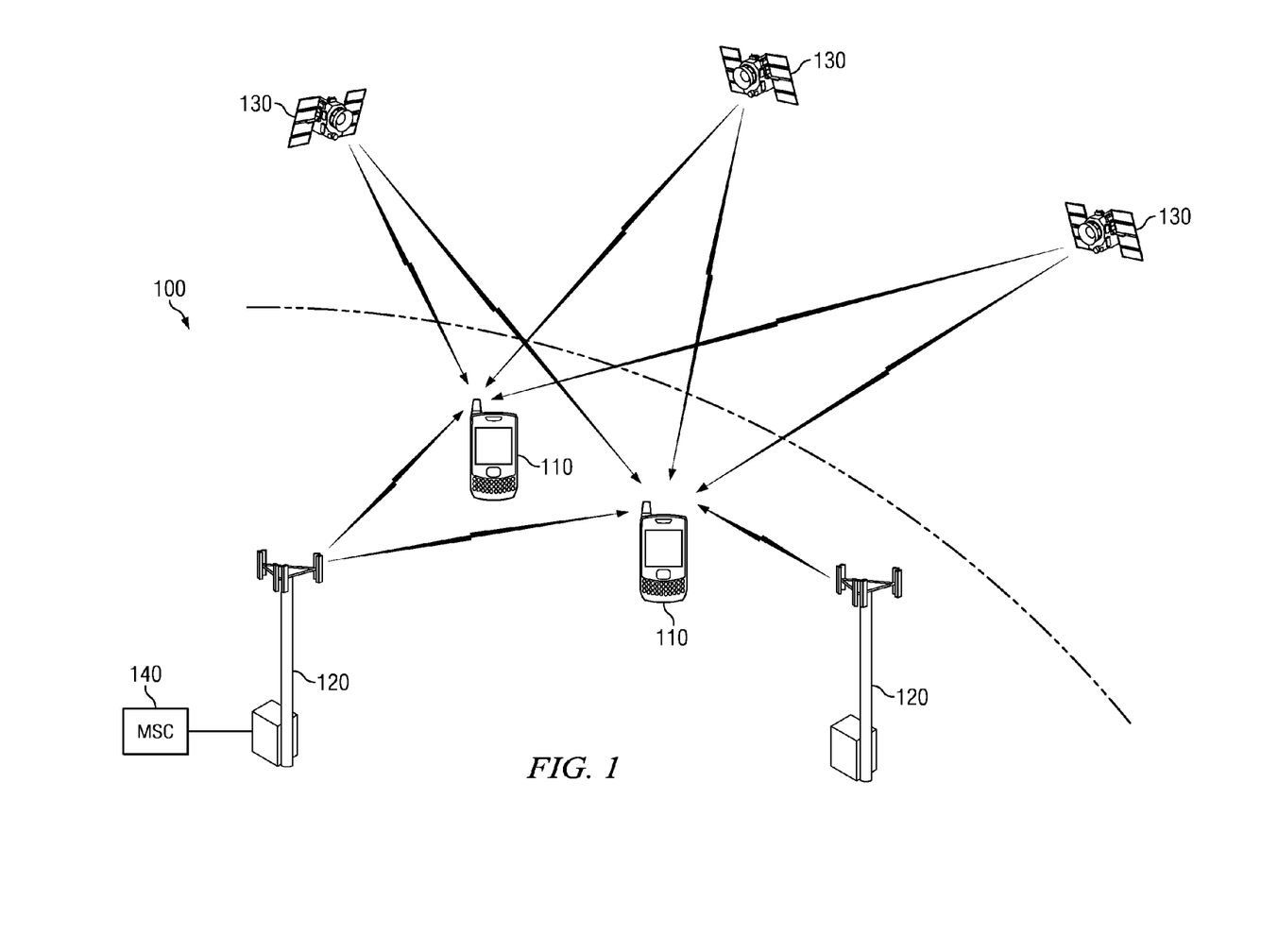
FIG. 1 illustrates a block diagram of an example wireless communication system, in accordance with certain embodiments of the present disclosure.

FIG. 1 illustrates a block diagram of an example wireless communication system 100, in accordance with certain embodiments of the present disclosure. For simplicity, only two terminals 110 and two base stations 120 are shown in FIG. 1. A terminal 110 may also be referred to as a remote station, a mobile station, an access terminal, user equipment (UE), a wireless communication device, a cellular phone, or some other terminology. A base station 120 may be a fixed station and may also be referred to as an access point, a Node B, or some other terminology. A mobile switching center (MSC) 140 may be coupled to the base stations 120 and may provide coordination and control for base stations 120.

A terminal 110 may or may not be capable of receiving signals from satellites 130. Satellites 130 may belong to a satellite positioning system such as the well-known Global Positioning System (GPS). Each GPS satellite may transmit a GPS signal encoded with information that allows GPS receivers on Earth to measure the time of arrival of the GPS signal. Measurements for a sufficient number of GPS satellites may be used to accurately estimate a three-dimensional position of a GPS receiver. A terminal 110 may also be capable of receiving signals from other types of transmitting sources such as a Bluetooth transmitter, a Wireless Fidelity (Wi-Fi) transmitter, a wireless local area network (WLAN) transmitter, an IEEE 802.11 transmitter, and any other suitable transmitter.

In FIG. 1, each terminal 110 is shown as receiving signals from multiple transmitting sources simultaneously, where a transmitting source may be a base station 120 or a satellite 130. In certain embodiments, a terminal 110 may also be a transmitting source. In general, a terminal 110 may receive signals from zero, one, or multiple transmitting sources at any given moment.

System 100 may be a Code Division Multiple Access (CDMA) system, a Time Division Multiple Access (TDMA) system, or some other wireless communication system. A CDMA system may implement one or more CDMA standards such as IS-95, IS-2000 (also commonly known as "1x"), IS-856 (also commonly known as "1xEV-DO"), Wideband-CDMA (W-CDMA), and so on. A TDMA system may implement one or more TDMA standards such as Global System for Mobile Communications (GSM). The W-CDMA standard is defined by a consortium known as 3GPP, and the IS-2000 and IS-856 standards are defined by a consortium known as 3GPP2.

Figure 2:
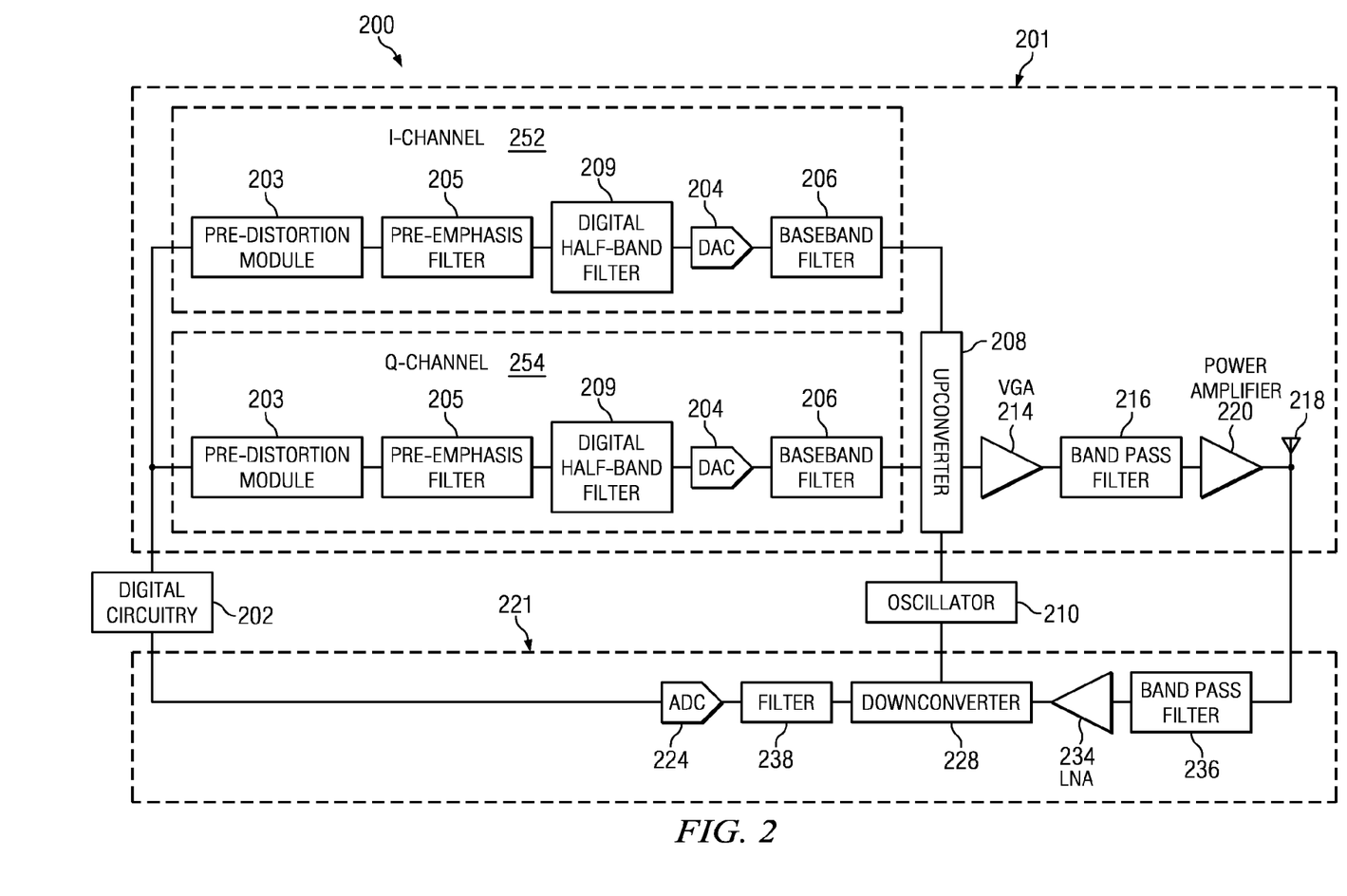
FIG. 2 illustrates a block diagram of selected components of an example transmitting and/or receiving element, in accordance with certain embodiments of the present disclosure.

FIG. 2 illustrates a block diagram of selected components of an example transmitting and/or receiving element 200 (e.g., a terminal 110, a base station 120, or a satellite 130), in accordance with certain embodiments of the present disclosure. Element 200 may include a transmit path 201 and/or a receive path 221. Depending on the functionality of element 200, element 200 may be considered a transmitter, a receiver, or a transceiver.

As depicted in FIG. 2, element 200 may include digital circuitry 202. Digital circuitry 202 may include any system, device, or apparatus configured to process digital signals and information received via receive path 221, and/or configured to process signals and information for transmission via transmit path 201. Such digital circuitry 202 may include one or more microprocessors, digital signal processors, and/or other suitable devices.

Transmit path 201 may include an in-phase (I-channel) path 252 and a quadrature phase (Q-channel) path 254. I-channel path 252 may carry in-phase components of a signal, while Q-channel path 254 may carry the quadrature components of the signal.

Each of I-channel path 252 and Q-channel path 254 may include a digital pre-distortion module 203. A pre-distortion module 203 may be any system, device, or apparatus configured to receive a digital signal from digital circuitry 202 and pre-distort the digital signal with the opposite phase of the C-IM3 distortion term such that the pre-distortion and C-IM3 distortion cancel each other out after digital-to-analog conversion and modulation of the signal by other components of transmit path. Pre-distortion module 203 is discussed in greater detail below.

Each of I-channel path 252 and Q-channel path 254 may further include a digital pre-emphasis filter 205. A pre-emphasis filter 205 may be any system, device, or apparatus configured to receive the pre-distorted digital signal from a corresponding pre-distortion module 203 to counter the effect of analog baseband filter 206 and digital half-band filter 209 of upconverter 208 upon the pre-distortion created by the corresponding pre-distortion module 203. A digital pre-emphasis filter 205 may also modify the pre-distorted digital signal in order to provide a flat amplitude response of a composite analog baseband filter 206 and digital half-band filter 209, and to provide a linear phase response for the composite filter. In addition or alternatively, pre-emphasis filter 205 may be configured to compensate for analog droop of a corresponding baseband filter 206 in case a narrow baseband filter bandwidth is used to avoid receive path 221 band noise.

As shown in FIG. 2, each of I-channel path 252 and Q-channel path 254 may also include a digital half-band filter 209. Digital half-band filter 209 may be any system, device or apparatus configured to further attenuate high-frequency components of the analog signal received from a pre-emphasis filter 205.

Each of I-channel path 252 and Q-channel path 254 may also include a digital-to-analog converter (DAC) 204. A DAC 204 may be configured to receive a pre-distorted, pre-emphasized digital signal from a corresponding pre-emphasis filter 205 and convert such digital signal into an analog signal. Such analog signal may then be passed to one or more other components of transmit path 201, including a baseband filter 206.

A baseband filter 206 may include any system, device or apparatus configured to pass low-frequency signals but attenuate signals with frequencies higher than a cutoff or baseband frequency. Thus, a baseband filter 206 may receive an analog signal from a corresponding DAC 204 and attenuate high-frequency components of such analog signal.

Upconverter 208 may be configured to frequency upconvert analog signals received from baseband filters 206 to a wireless communication signal at a radio frequency based on an oscillator signal provided by oscillator 210.

Oscillator 210 may be any suitable device, system, or apparatus configured to produce an analog waveform of a particular frequency for modulation or upconversion of an analog signal to a wireless communication signal, or for demodulation or downconversion of a wireless communication signal to an analog signal. In some embodiments, oscillator 210 may be a digitally-controlled crystal oscillator.

Transmit path 201 may include a variable-gain amplifier (VGA) 214 to amplify an upconverted signal for transmission, and a bandpass filter 216 configured to receive an amplified signal from VGA 214 and pass signal components in the band of interest and remove out-of-band noise and undesired signals. The bandpass filtered signal may be received by power amplifier 220 where it is amplified for transmission via antenna 218. Antenna 218 may receive the amplified and transmit such signal (e.g., to one or more of a terminal 110, a base station 120, and/or a satellite 130).

Receive path 221 may include a bandpass filter 236 configured to receive a wireless communication signal (e.g., from a terminal 110, a base station 120, and/or a satellite 130) via antenna 218. Bandpass filter 236 may pass signal components in the band of interest and remove out-of-band noise and undesired signals. In addition, receive path 221 may include a low-noise amplifier (LNA) 234 to amplify a signal received from bandpass filter 236.

Receive path 221 may also include a downconverter 228. Downconverter 228 may be configured to frequency downconvert a wireless communication signal received via antenna 218 and amplified by LNA 234 by an oscillator signal provided by oscillator 210 (e.g., downconvert to a baseband signal). Receive path 221 may further include a filter 238, which may be configured to filter a downconverted wireless communication signal in order to pass the signal components within a radio-frequency channel of interest and/or to remove noise and undesired signals that may be generated by the downconversion process. In addition, receive path 221 may include an analog-to-digital converter (ADC) 224 configured to receive an analog signal from filter 238 and convert such analog signal into a digital signal. Such digital signal may then be passed to digital circuitry 202 for processing.

Figure 3:
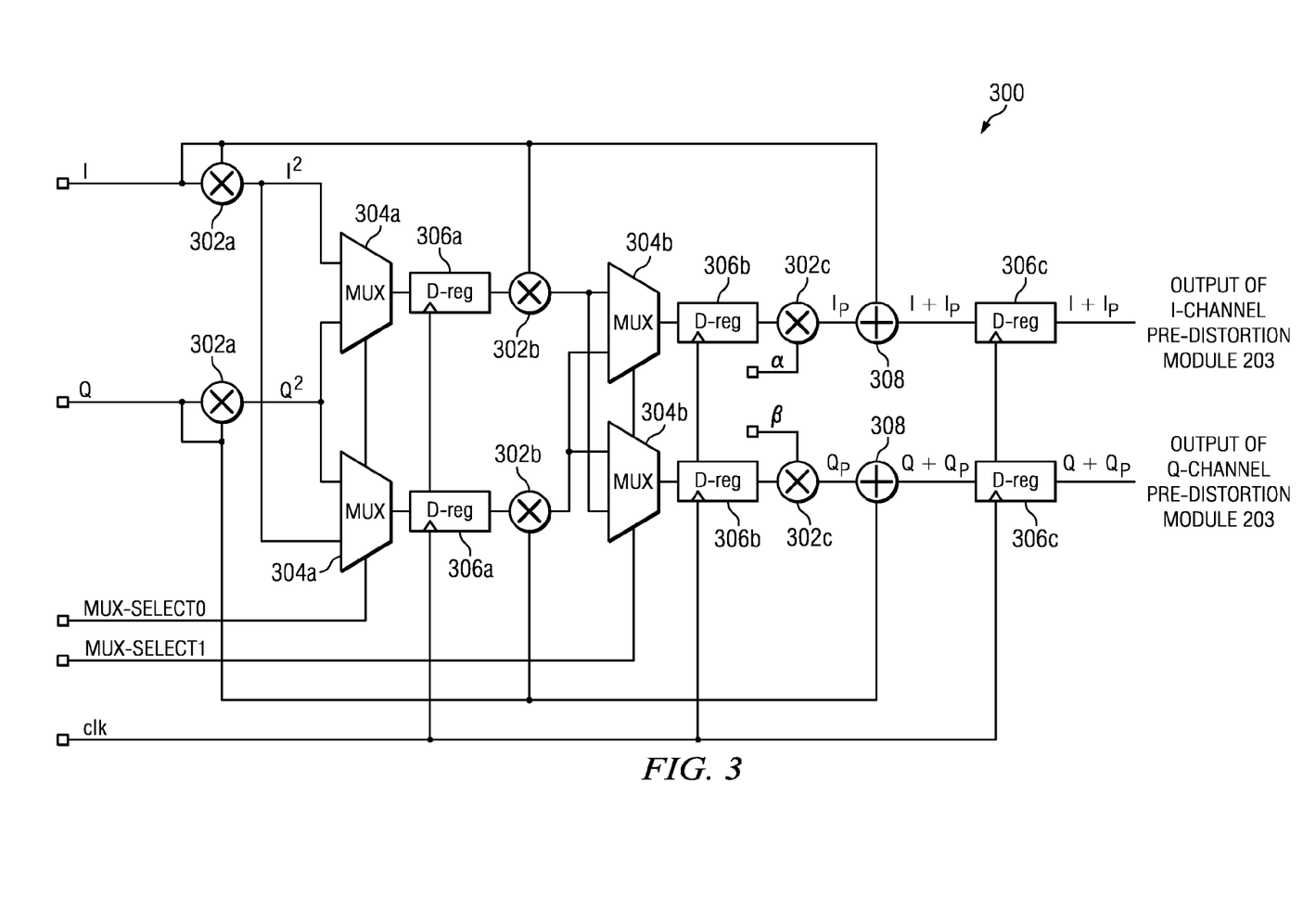
FIG. 3 illustrates logic for generating pre-distortion components in a pre-distortion modules, in accordance with certain embodiments of the present disclosure.

As discussed above, a pre-distortion module 203 may be configured to receive a digital signal from digital circuitry 202 and pre-distort the digital signal with the opposite phase of the C-IM3 distortion term such that the pre-distortion and C-IM3 distortion cancel each other out after digital-to-analog conversion and modulation of the signal by other components of transmit path. As I-channel path 252 and Q-channel path 254 are present, pre-distortion may be added to both of the in-phase and quadarature components of a signal. Several formulas may be used to predict the C-IM3 distortion and/or generate pre-distortion, including without limitation:

$$I_p=\alpha I^3 \text{ and } Q_p=\beta Q^3;$$

$$I_p=\alpha I^2 Q \text{ and } Q_p=\beta I Q^2; \text{ and}$$

$$I_p=\alpha I Q^2 \text{ and } Q_p=\beta I^2 Q;$$

where I and Q are the fundamental in-phase and quadrature components of the baseband frequency response, $I_p$ and $Q_p$ are in-phase and quadrature components of the predicted C-IM3 spurious emission (i.e. pre-distortion to be added to I and Q in the digital domain), and α and β are real constants which may be labeled as pre-distortion coefficients. Logic 300 for generating pre-distortion components in pre-distortion modules 203 is depicted in FIG. 3.

As shown in FIG. 3, logic 300 may include multipliers 302a for squaring each of I and Q, the fundamental component in-phase and quadrature components of the digital baseband signal. Each of $I^2$ and $Q^2$ may be fed to inputs of multiplexers 304a, such that each multiplexer selects one of $I^2$ and $Q^2$ based on a select signal mux_select0. The outputs of multiplexers may be latched by latches 306a. An output of one latch 306a may be multiplied by I by a multiplier 302b, yielding a result of $I^3$ or $IQ^2$. An output of another latch 306b may be multiplied by Q by a multiplier 302b, yielding a result of $I^2Q$ or $Q^3$. Each multiplexer 304b may select between the outputs of multipliers 302b based on a select signal mux_select1. The outputs of multiplexers 304b, which may be one of $I^3$, $I^2Q$, $IQ^2$, or $Q^3$ may be latches by latches 306b. An output of one latch 306b may be multiplied by pre-distortion coefficient α by a multiplier 302c, yielding the in-phase component of predicted C-IM3 spurious emission $I_p$. An output of another latch 306b may be multiplied by pre-distortion coefficient β by a multiplier 302c, yielding the quadrature component of predicted C-IM3 spurious emission $Q_p$. $I_p$ may be added to fundamental in-phase component I at an adder 308, and $Q_p$ may be added to fundamental in-phase component Q at another adder 308. The results of adders 308 may latches by latches 306c. The output of one latch 306c may constitute the output of pre-distortion module 205 of I-channel path 252, and the output of the other latch 306c may constitute the output of pre-distortion module 205 of Q-channel path 254.

In some embodiments, pre-distortion coefficients α and β may be obtained by a "cold calibration" procedure at power up and/or reset of element 200 via any suitable search algorithm. For example, α and/or β may be swept across a range of potential values and the C-IM3 amplitude may be measured at the receiver element 224 and measured results may be used for deriving coefficient values to be used during operation. Coefficient values which provide the lowest amplitude C-IM3 distortion may then be selected as the values to be used during operation of element 200. In designs in which radio-frequency switching gains are required (e.g., such as when stepped variable gain amplifiers are used), pre-distortion coefficients may be obtained by performing the cold calibration procedure on all required gain stages. In other embodiments, pre-distortion coefficients may be determined by lab validation, and pre-determined coefficients may be stored in memory and/or firmware of element 200. In yet other embodiments, pre-distortion coefficients may be determined via hardware testing of element 200 or its components (e.g., silicon final test), wherein 4×BB terms may be analyzed during the test and the coefficients determined and stored on a memory. At power on or reset, element 200 may read the stored coefficients from memory.

Because characteristics of element 200 may change after power on and/or reset of element 200 (e.g., temperature increase may change the electrical properties of certain components of element 200), it may be desired that pre-distortion coefficients may be modified during operation to account for such variations. For example, in the event of changes in the gain of VGA 214, one or both of the pre-distortion coefficients may be modified. As another example, in the event of a change in the digital gain of transmit path 201 (e.g., a change in the output level of a DAC 204), one or both of the pre-distortion coefficients may be scaled based on the change in digital gain (e.g., $\alpha_{new}=\alpha_{previous}\times\sqrt{(gain_{new}/gain_{previous})}$). As a further example, in the event of a change in the temperature of components of transmit path 201, one or both of the pre-distortion coefficients may be scaled based on the change in temperature (e.g., $\alpha_{new}=\alpha_{previous}\times T_{new}/T_{previous}$). Methods other than those disclosed above may be used for scaling pre-distortion coefficients in response to gain or temperature changes. Exact formulas for scaling may be obtained by lab characterization based on transceiver architecture, or other suitable approach.

Also as discussed above, pre-emphasis filter 205 may be configured to, among other things, receive the pre-distorted digital signal from pre-distortion module 203 to counter the effect of analog baseband filter 206 and digital half-band filter 209 of upconverter 208 upon the pre-distortion created by pre-distortion module 203. Pre-emphasis filter 205 may be designed using a zero-forcing algorithm or any other suitable means, based on the amplitude and phase responses of baseband filter 206. Baseband filter 206 amplitude response and phase deviation from linear phase may be derived from information obtained in a cold-calibration procedure on power/on or reset of element 200 or based on simulations of baseband filter 206. Pre-emphasis filter 205 may be designed such that the combined response of baseband filter 206, the digital half-band filter 209, and pre-emphasis filter 205 produces a flat magnitude response and linear phase response (or constant group delay), such that the pre-distorted signal cancels out C-IM 3 spurious emission. In implementations in which a zero-forcing algorithm is used to design pre-emphasis filter 205, design of such filter may take place in accordance with the steps depicted in FIG. 4.

Figure 4:
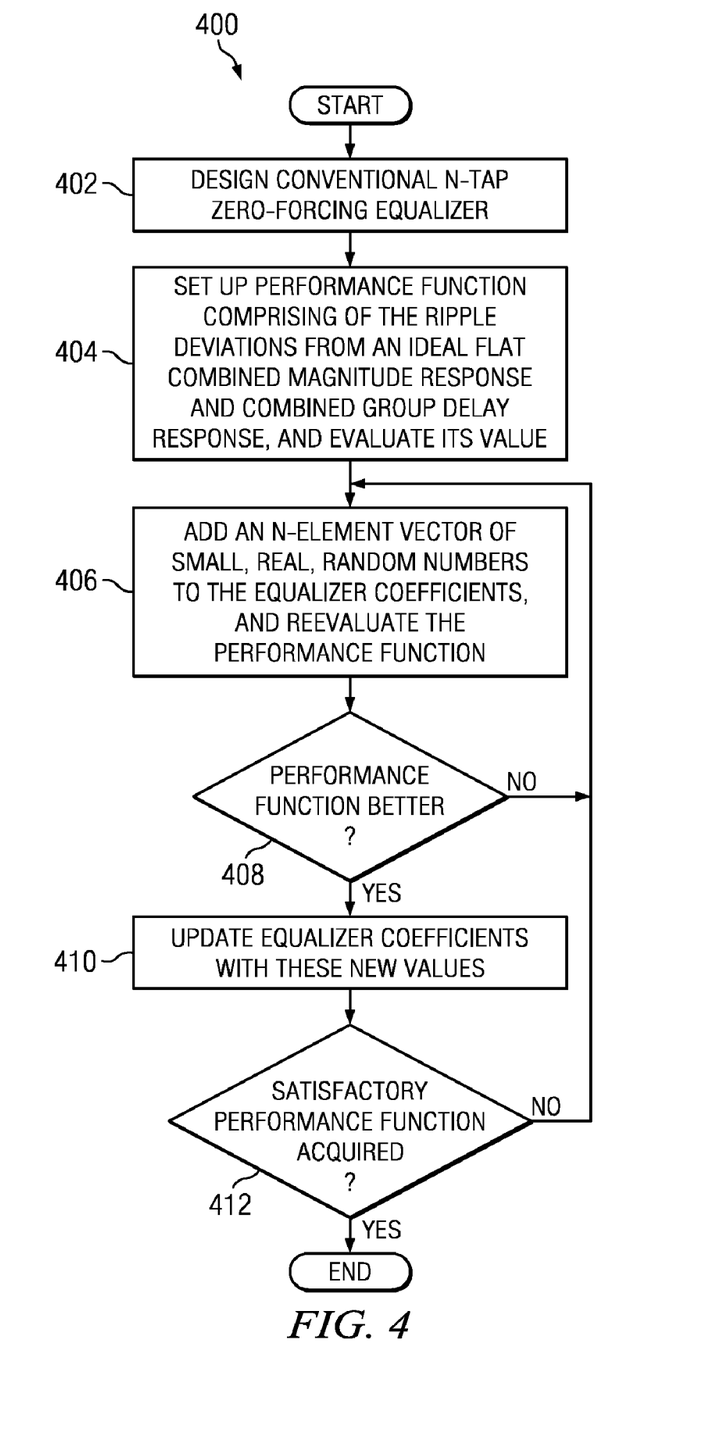
FIG. 4 illustrates a flow chart of an example method for design of a pre-emphasis filter, in accordance with certain embodiments of the present disclosure.

FIG. 4 depicts a flow chart of an example method 400 for design of a pre-emphasis filter 205. According to one embodiment, method 400 may begin at step 402. As noted above, teachings of the present disclosure may be implemented in a variety of configurations of system 100. As such, the initialization point for method 400 and the order of the steps 402-412 comprising method 400 may depend on the implementation chosen.

At step 402, a conventional N-tap zero-forcing equalizer, as is known in the art, may be created. At step 404, a performance function for the N-tap zero-forcing equalizer may be set up, comprising the ripple deviations from an ideal flat combined magnitude response and combined group delay response for the composite analog baseband filter, digital half-band filter, and pre-distortion module/pre-emphasis filter, and the value of such performance function may be evaluated.

At step 406, an N-element vector of small, real, random numbers may be added to the equalizer coefficients, and the performance function may be re-evaluated. At step 408, a determination may be made regarding whether the performance function produced a better result than the previous performance function. If not, step 406 may be repeated. Otherwise, method 400 may proceed to step 410.

At step 410, the equalizer coefficients may be updated with these new values after addition of the N-element vector at step 406. At step 412, a determination may be made regarding whether a satisfactory performance function for the composite analog baseband filter, digital half-band filter, and pre-distortion module/pre-emphasis filter is achieved. If so, method 400 may end. Otherwise, method 400 may proceed again to step 406.

Although FIG. 4 discloses a particular number of steps to be taken with respect to method 400, method 400 may be executed with greater or lesser steps than those depicted in FIG. 4. In addition, although FIG. 4 discloses a certain order of steps to be taken with respect to method 400, the steps comprising method 400 may be completed in any suitable order.

Figure 5:
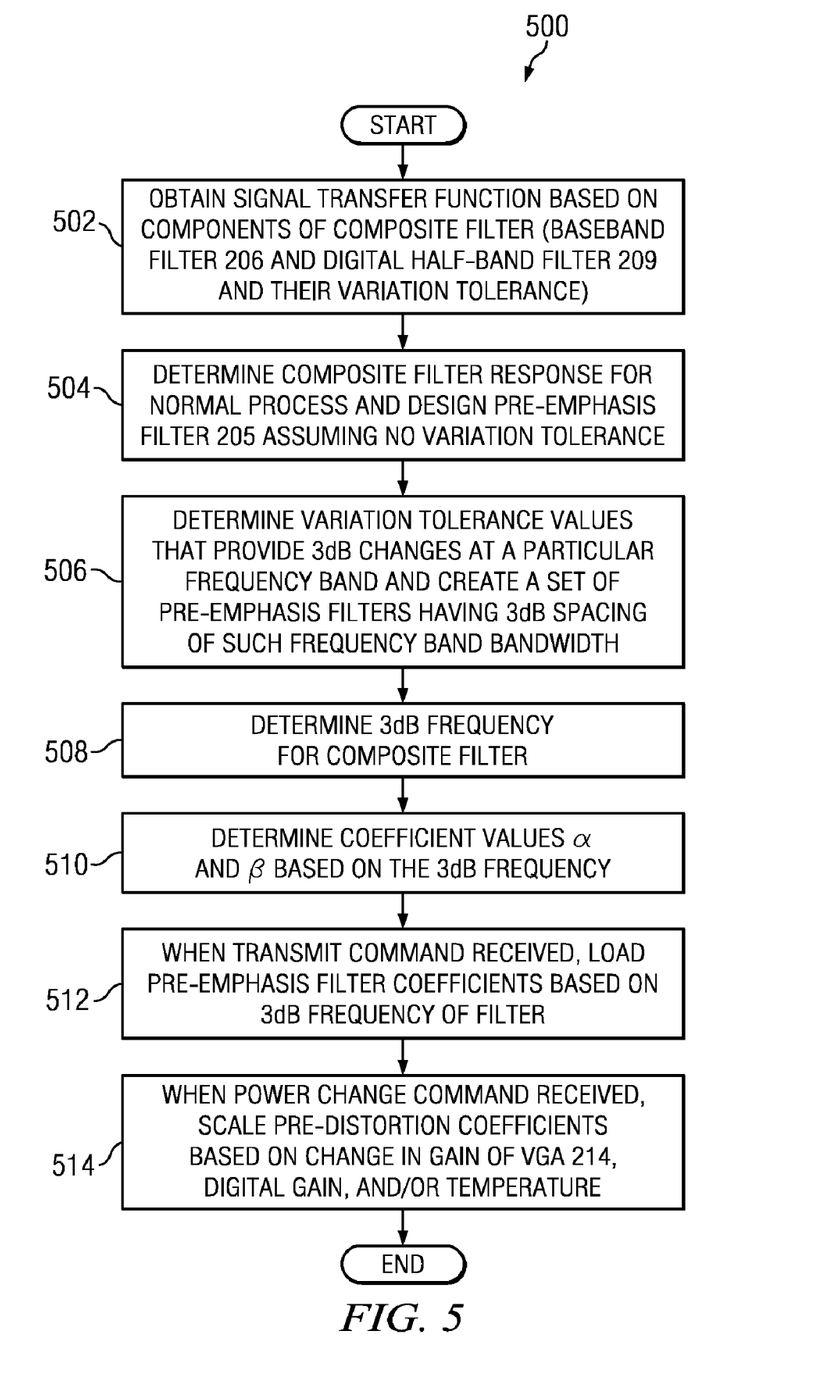
FIG. 5 illustrates a flow chart of an example method for design of a pre-emphasis filter.

Method 400 may be implemented at either cold-calibration at power up or offline, via characterization of any component of element 200, and/or any other system operable to implement method 400. When pre-emphasis filter 205 design is performed at cold calibration, the characterized process is performed by measuring the amplitude and phase response using the receive path 221 as depicted in element 200. When pre-emphasis filter 205 design is performed off-line, the characterization process may be performed by simulation and/or silicone validation. In the latter case (silicon validation, as depicted in FIG. 5), a set of coefficients that cover worst case process variation may be designed and stored with firmware. At power up, cold calibration may measure a 3-db corner frequency, and firmware may select coefficients based on the 3-dB corner frequency. In certain embodiments, method 400 may be implemented partially or fully in software and/or firmware embodied in computer-readable media.

As with pre-distortion module 203, process variations and operating conditions may cause the performance of pre-emphasis filter 205 to vary. Accordingly, in certain embodiments, a plurality of possible pre-emphasis filters may be designed (as discussed above with respect to FIG. 4) and available for selection in element 200. At power on and/or reset, a cold calibration procedure may measure characteristics of element 200 (e.g., 3 dB attenuation point (3-dB frequency) of the composite digital half-band filters 209, DACs 204, and baseband filters 206), and based on such characteristics, select one of the plurality of possible pre-emphasis filters as the pre-emphasis filter 205 for operation of element 200. During operation, the selected pre-emphasis filter 205 may be modified to take into account operating conditions that might alter its functionality (e.g., temperature variations). Temperature information may be obtained from an on-chip temperature sensor or off-chip temperature reading. For example, in response to a transmit command being issued in element 200, equalizer coefficients for the zero-forcing equalizer of pre-emphasis filter 205 may be modified to achieve the desired 3 dB corner frequency for the combined filter response. Greater detail regarding the cold calibration procedures and online modification are set forth in FIG. 5, below.

FIG. 5 depicts a flow chart of an example method 500 for design of a pre-emphasis filter 205. According to one embodiment, method 500 may begin at step 502. As noted above, teachings of the present disclosure may be implemented in a variety of configurations of system 100. As such, the initialization point for method 500 and the order of the steps 502-514 comprising method 500 may depend on the implementation chosen.

At step 502, pre-emphasis filter 205 or another component of element 200 may obtain a signal transfer function for the composite digital half-band filter 209, DAC 204 and analog baseband filter 206 based on components of the composite filter and their tolerances. At step 504, pre-emphasis filter 205 or another component of element 200 may determine a composite filter response assuming no variation tolerance and design a possible pre-emphasis filter assuming no variation tolerance.

At step 506, pre-emphasis filter 205 or another component of element 200 may determine variation tolerance values that provide for 3 decibel (dB) changes at a particular frequency (e.g., 500 KHz step) and create a set of possible pre-emphasis filters having 3 dB spacing of such frequency step bandwidth. All such possible pre-emphasis filters may be represented by corresponding filter coefficients and those coefficients may be stored using their 3 dB frequency as an index.

At step 508, a 3 dB frequency may be determined for the composite filter. For example, at power on or reset, a set of tone signals may be communicated through transmit path 201 and corresponding signals received by receiver path 221 may be analyzed to compute a 3 dB frequency for the composite filter.

At step 510, the 3 dB frequency for the composite filter (determined at step 508) may be used to select a set of coefficients (created at step 506). The selected coefficients may be loaded in the pre-emphasis filters 205. A set of signals (e.g., tones or modulated signals) may be transmitted through element 200. Signals received by receive path 221 may be analyzed for 4×BB terms. These analyzed results may then be used to determine coefficients α and β. This analysis procedure may include, without limitation, the following:
  searching through possible values of α, and selecting the one that results in the minimum 4×BB emissions; and
  measuring the 4×BB terms at a limited set of α values, and use the measured results to derive an optimum value for α.

Steps 512 and 514 describe procedures that may be used in an actual communication. At step 512, when a transmit command is received for element 200, coefficients determine at steps 508 and 510 based on the 3-dB frequency may be loaded into pre-emphasis filters 205 (e.g., α and β values determined at step 510 may be loaded into pre-distortion filters 205). At step 514, in response to a change in gain of variable gain amplifier 214, digital gain, and/or temperature, pre-emphasis filter 205 or another component of element 200 may scale the pre-emphasis filter coefficients.

Although FIG. 5 discloses a particular number of steps to be taken with respect to method 500, method 500 may be executed with greater or lesser steps than those depicted in FIG. 5. In addition, although FIG. 5 discloses a certain order of steps to be taken with respect to method 500, the steps comprising method 400 may be completed in any suitable order.

Method 500 may be implemented using any component of element 200, and/or any other system operable to implement method 500. In certain embodiments, method 500 may be implemented partially or fully in software and/or firmware embodied in computer-readable media.

Modifications, additions, or omissions may be made to system 100 from the scope of the disclosure. The components of system 100 may be integrated or separated. Moreover, the operations of system 100 may be performed by more, fewer, or other components. As used in this document, "each" refers to each member of a set or each member of a subset of a set.

Although the present disclosure has been described with several embodiments, various changes and modifications may be suggested to one skilled in the art. It is intended that the present disclosure encompass such changes and modifications as fall within the scope of the appended claims.

What is claimed is:

1. A transmitter comprising:
    a digital-to-analog converter configured to convert a digital baseband signal into an analog baseband signal;
    a baseband filter configured to filter the analog baseband signal;
    an upconverter configured to modulate the analog baseband signal to provide a radio-frequency signal;
    a variable gain amplifier configured to amplify the radio-frequency signal;
    a digital pre-distortion module configured to pre-distort the digital baseband signal with the opposite phase of a C-IM3 distortion term such that the pre-distortion and C-IM3 distortion cancel each other out; and
    a digital pre-emphasis filter configured to condition the pre-distorted digital signal in order to provide a flat amplitude response of a composite filter comprising the baseband filter and a digital half-band filter, and to provide a linear phase response for the composite filter.

2. A transmitter according to claim 1, wherein the response of the digital pre-distortion module is based on one or more pre-distortion terms, each pre-distortion term including a third-order polynomial, wherein variables of the polynomial comprise frequency response components of the digital baseband signal and a coefficient of a third-order term of the polynomial comprises a pre-distortion coefficient.

3. A transmitter according to claim 2, wherein the pre-distortion coefficient is determined at power on or reset of the transmitter based on a search algorithm.

4. A transmitter according to claim 3, wherein:
    the pre-distortion coefficient is, at power on or reset, swept across a range of potential values;
    amplitude of C-IM3 distortion is measured for each of the values; and
    the value providing the lowest amplitude C-IM3 distortion is selected as the pre-distortion coefficient for operation of the pre-distortion module.

5. A transmitter according to claim 4, wherein the value of the pre-distortion coefficient may be modified during operation in response to changes in operating characteristics of the transmitter.

6. A transmitter according to claim 5, wherein the operating characteristics may comprise at least one of a change in a gain of the variable gain amplifier; a change in a digital gain of the transmit path; and a change in temperature of one or more components of the transmitter.

7. A transmitter according to claim 2, wherein the pre-distortion coefficient is determined by lab validation of the transmitter and is stored in a memory of the transmitter.

8. A transmitter according to claim 2, wherein the pre-distortion coefficient is determined by hardware testing of the transmitter based on analysis of the C-IM3 distortion term and stored in a memory of the transmitter, further wherein the pre-distortion coefficient may be loaded from the memory during power on or reset of the transmitter.

9. A transmitter according to claim 1, wherein the pre-emphasis filter is selected from a plurality of possible pre-emphasis filters such that the selected pre-emphasis filter provides a desired 3-dB frequency for the composite filter.

10. A transmitter according to claim 7, wherein characteristics of the pre-emphasis filter may be modified during operation in response to changes in operating characteristics of the transmitter.

11. A wireless communication element, comprising:
    a receive path configured to receive wireless communications signal and convert the wireless communications signal into digital signals; and
    a transmit path configured to digital signals into a wireless communication signals, the transmit path comprising;
        a digital-to-analog converter configured to convert a digital baseband signal into an analog baseband signal;
        a baseband filter configured to filter the analog baseband signal;
        an upconverter configured to modulate the analog baseband signal to provide a radio-frequency signal;
        a variable gain amplifier configured to amplify the radio-frequency signal;
        a digital pre-distortion module configured to pre-distort the digital baseband signal with the opposite phase of a C-IM3 distortion term such that the pre-distortion and C-IM3 distortion cancel each other out; and
        a digital pre-emphasis filter configured to condition the pre-distorted digital signal in order to provide a flat amplitude response of a composite filter comprising the baseband filter and a digital half-band filter, and to provide a linear phase response for the composite filter.

12. An element according to claim 11, wherein the response of the digital pre-distortion module is based on one or more pre-distortion terms, each pre-distortion term including a third-order polynomial, wherein variables of the polynomial comprise frequency response components of the digital baseband signal and a coefficient of a third-order term of the polynomial comprises a pre-distortion coefficient.

13. An element according to claim 12, wherein the pre-distortion coefficient is determined at power on or reset of the element based on a search algorithm.

14. An element according to claim 13, wherein:
the pre-distortion coefficient is, at power on or reset, swept across a range of potential values;
amplitude of C-IM3 distortion is measured for each of the values; and
the value providing the lowest amplitude C-IM3 distortion is selected as the pre-distortion coefficient for operation of the pre-distortion module.

15. An element according to claim 14, wherein the value of the pre-distortion coefficient may be modified during operation in response to changes in operating characteristics of the element.

16. An element according to claim 15, wherein the operating characteristics may comprise at least one of a change in a gain of the variable gain amplifier; a change in a digital gain of the transmit path; and a change in temperature of one of more components of the element.

17. A element according to claim 12, wherein the pre-distortion coefficient is determined by lab validation of the transmitter and is stored in a memory of the transmitter.

18. A element according to claim 12, wherein the pre-distortion coefficient is determined by hardware testing of the element based on analysis of the C-IM3 distortion term and stored in a memory of the element, further wherein the pre-distortion coefficient may be loaded from the memory during power on or reset of the element.

19. An element according to claim 11, wherein the pre-emphasis filter is selected from a plurality of possible pre-emphasis filters such that the selected pre-emphasis filter has a desired 3-dB frequency for the composite filter.

20. An element according to claim 19, wherein characteristics of the pre-emphasis filter may be modified during operation in response to changes in operating characteristics of the element.

21. A method comprising:
digitally pre-distorting a digital baseband signal with an opposite phase of a C-IM3 distortion term such that the pre-distortion and C-IM3 distortion cancel each other out in a transmitter; and
digitally conditioning the pre-distorted digital signal in order to provide a flat amplitude response of a composite filter comprising a baseband filter and a digital half-band filter of the transmitter, and to provide a linear phase response for the composite filter.

22. A method according to claim 21, wherein the response of the digital pre-distortion module is based on one or more pre-distortion terms, each pre-distortion term including a third-order polynomial, wherein variables of the polynomial comprise frequency response components of the digital baseband signal and a coefficient of a third-order term of the polynomial comprises a pre-distortion coefficient, the method further comprising:
at power on or reset, sweeping the pre-distortion coefficient across a range of potential values;
measuring an amplitude of C-IM3 distortion for each of the values; and
selecting the value providing the lowest amplitude C-IM3 distortion as the pre-distortion coefficient for digitally pre-distorting the digital baseband signal.

23. A method according to claim 22, further comprising modifying the value of the pre-distortion coefficient during operation in response to changes in operating characteristics of the transmitter.

24. A method according to claim 21, further comprising selecting the pre-emphasis filter from a plurality of possible pre-emphasis filters such that the selected pre-emphasis filter provides a desired 3-dB frequency for the composite filter.

* * * * *